(12) United States Patent
Yamada et al.

(10) Patent No.: US 6,844,614 B2
(45) Date of Patent: Jan. 18, 2005

(54) SEMICONDUCTOR INTEGRATED CIRCUIT

(75) Inventors: Masao Yamada, Kariya (JP); Junji Sugiura, Toyota (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/680,117

(22) Filed: Oct. 8, 2003

(65) Prior Publication Data

US 2004/0075169 A1 Apr. 22, 2004

(30) Foreign Application Priority Data

Oct. 21, 2002 (JP) ........................................ 2002-306018

(51) Int. Cl.$^7$ .......................................... H01L 23/495
(52) U.S. Cl. ..................................... 257/666; 257/676
(58) Field of Search ................................ 257/666, 676, 257/723, 678

(56) References Cited

U.S. PATENT DOCUMENTS 3,791,025 A * 2/1974 Guarjado ..................... 29/827

FOREIGN PATENT DOCUMENTS

JP    A-2000-307397    11/2000

* cited by examiner

Primary Examiner—Roy Potter
(74) Attorney, Agent, or Firm—Posz & Bethards, PLC

(57) ABSTRACT

A semiconductor integrated circuit has a P-channel FET and a diode. The FET and the diode are mounted on a single island of a lead frame so that a drain of the transistor and a cathode of the diode have a common electrical potential. The island is depressed, and a non-chip-mounted surface of the island is exposed from the undersurface of a package.

12 Claims, 4 Drawing Sheets

SEMICONDUCTOR INTEGRATED CIRCUIT

CROSS REFERENCE TO RELATED APPLICATION

This application is based on Japanese Patent Application No. 2002-306018 filed on Oct. 21, 2002, the contents of which are incorporated herein by reference.

BACKGROUND OF THE INVENTION

1. Field of the Invention

The present invention relates to a semiconductor integrated circuit that has a plurality of chips on a lead frame.

2. Description of Related Art

In a metal oxide semiconductor field effect transistor (MOSFET), there are a P-channel MOSFET and a N-channel MOSFET. The N-channel MOSFET has a low ON-resistance in comparison with the P-channel MOSFET. Accordingly, the N-channel MOSFET is used for a particular use that requires flowing a large electrical current, such as for driving a motor. JP-A-2000-307397 discloses a high-side switch that uses the N-channel MOSFET.

As shown in FIGS. 8, 9, an integrated circuit (IC) 1 for driving a motor has lead wires 2, 3 for connecting to a power supply, a lead wire 4 for inputting a control signal, and lead wires 5, 6 for connecting to the motor. The IC 1 also has a N-channel MOSFET 7, a diode 8, a driving IC 9, and capacitors 10, 11, 12, 13 on a lead frame. A drain and a source of the N-channel MOSFET 7 are connected between the lead wires 2, 5. A cathode and an anode of the diode 8 are connected between the lead wires 5, 6. The diode 8 is a fast recovery diode. The driving IC 9 produces a PWM driving signal for a gate of the MOSFET 7 based on the control signal.

The undersurface side of the MOSFET 7 is the drain, and the undersurface side of the diode 8 is the cathode. Accordingly, the MOSFET 7 and the diode 8 cannot be mounted on a single island due to a difference between their electrical potentials. As a result, the MOSFET 7, the diode 8, and the driving IC 9 are mounted on separate islands 14, 15, 16, respectively.

When electrical currents flow through the MOSFET 7 and the diode 8, the MOSFET 7 and the diode 8 generate heat. The amounts of the heat from the MOSFET 7 and the diode 8 vary according to a specification of the motor and a duty ratio of the PWM driving signal. Accordingly, it is necessary to have adequate sizes of the islands and the lead wires so that the heat generated from the MOSFET 7 and the diode 8 can be radiated from the islands 14, 15 via inner lead wires and outer lead wires. As a result, it is difficult to reduce a package 17 of the IC 1 in size.

In such an IC 1, even when non-chip-mounted surfaces of the islands 14, 15 are exposed from the undersurface of the package 17 and a cooling plate is mounted to the surfaces of the islands 14, 15, it is necessary to have an insulating sheet between the islands 14, 15 and the cooling plate because the islands 14, 15 have complicated structures and it is difficult to isolate the islands 14, 15. As a result, thermal resistances are increased, and cooling capabilities are decreased.

SUMMARY OF THE INVENTION

The present invention therefore has an object to provide a semiconductor integrated circuit that are downsized and has enough cooling capability.

According to one aspect of the present invention, a semiconductor integrated circuit includes a transistor and a diode that are mounted on a single island of a lead frame.

In detail, a source or an emitter of the transistor is connected to a first lead wire for a high electric potential side of a power supply. A drain or a collector of the transistor is connected to a second lead wire for a high electric potential side of an external load. A cathode of the diode is connected to the second lead wire. An anode of the diode is connected to a third lead wire for a low electric potential side of the external load. Accordingly, the transistor and the diode are included in a high-side switch, so that the drain or the collector of the transistor and the cathode of the diode have a common electrical potential.

As a result, the transistor and the diode can be mounted on the single island of the lead frame so that the drain or the collector of the transistor and the cathode of the diode are connected to the single island and are connected to each other.

When the transistor and the diode are mounted on the single island, heat radiation efficiency is improved in comparison with the related art in which the transistor and the diode are mounted on separate islands. This is because the island and the lead wires, which contribute to the heat radiation from the transistor and the diode, are effectively increased in size. As a result, the island can be reduced in size as a whole, and the package is reduced in size.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

Figure 1:
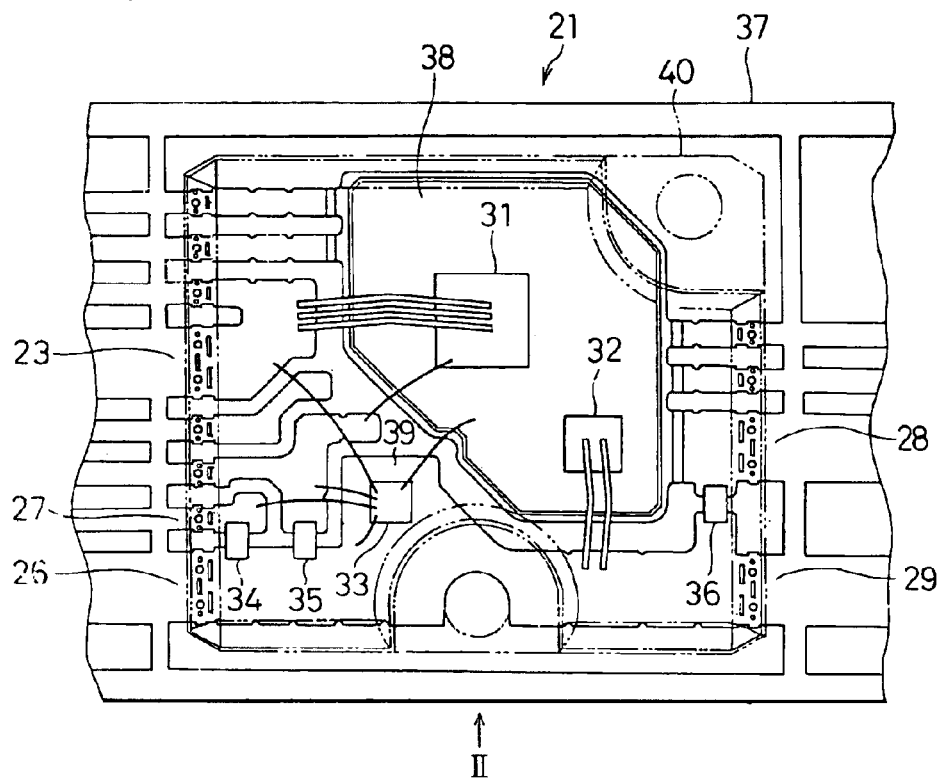
FIG. 1 is a top view showing an IC in a condition that chips are mounted on a lead frame according to a first embodiment of the present invention.

The preferred embodiments of the present invention will be explained with reference to the accompanying drawings. In the drawing, the same numerals are used for the same components and devices.

First Embodiment

As shown in FIG. 1, a semiconductor integrated circuit (IC) 21 has a MOSFET 31 and a diode 32 on a first island 38. The IC 21 has a driving integrated circuit (IC) 33 on a second island 39. The IC 21 also has lead wires 23, 26, 27, 28, 29.

Figure 5:
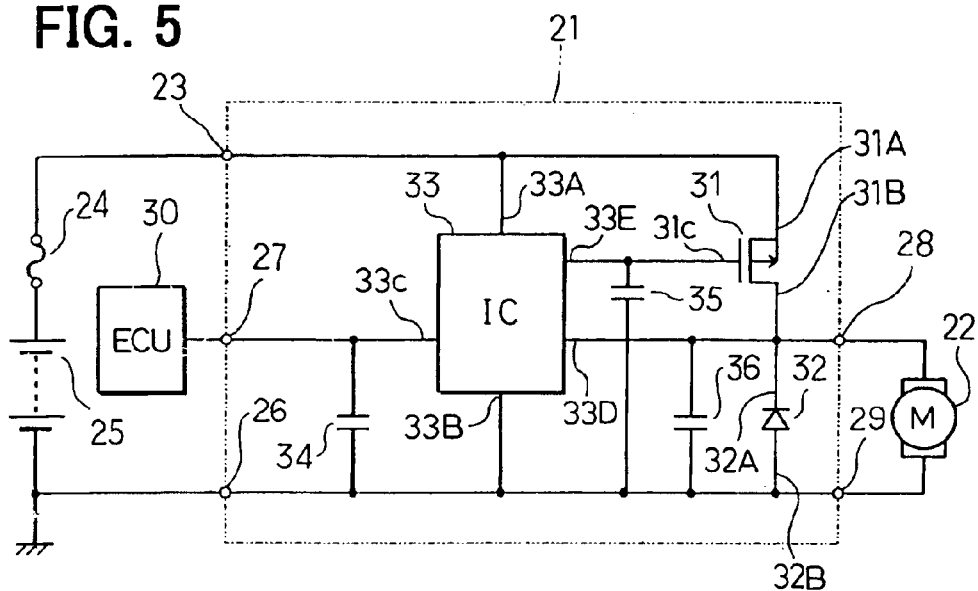
FIG. 5 is a circuit diagram showing circuit components of the IC according to the first embodiment.

As shown in FIG. 5, the IC 21 is used for driving a motor 22 that is mounted on a vehicle. In the IC 21, the lead wire 23 for a high electric potential side of a power supply is connected to a positive electrode of a battery 25 via a fuse 24. The lead wire 26 for a low electric potential side of the power supply is connected to a negative electrode of the battery 25. The lead wire 27 for inputting a control signal is connected to an output terminal of an electrical control unit (ECU) 30. The ECU 30 outputs a control signal from the output terminal to the lead wire 27. The lead wire 28 for a high electric potential side of an output is connected to a positive terminal of the motor 22. The lead wire 29 for a low electric potential side of the output is connected to a negative terminal of the motor 22. The lead wires 26, 29 are connected to each other within the IC 21.

The IC 21 also has the MOSFET 31, the diode 32, the driving IC 33, and capacitors 34, 35, 36. The MOSFET 31 is a bare chip of a P-channel type MOSFET, which is a kind of transistors. The diode 32 is a bare chip of a fast recovery diode, and it circulates an electrical current. The driving IC 33 is a bare chip of an IC, and it produces a driving signal for a gate 31C of the MOSFET 31 based on the control signal. The capacitors 34, 35, 36 are chip types of capacitors, and are filters for eliminating noises of signals. Since the P-channel type MOSFET 31 is used in the IC 21, it is not necessary for the IC 21 to have a charge pump circuit and a capacitor for the charge pump circuit.

A source 31A and a drain 31B of the MOSFET 31 are connected to the lead wires 23, 28, respectively. A cathode 32A and an anode 32B of the diode 32 are connected to the lead wires 28, 29, respectively. The driving IC 33 has a first pad 33A for a high electric potential side of the power supply, a second pad 33B for a low electric potential side of the power supply, a third pad 33C for inputting the control signal, a fourth pad 33D for inputting a voltage detection signal, and a fifth pad 33E for outputting the driving signal. The first through fifth pads 33A to 33E are connected to lead wires 23, 26, 27, 28, and the gate 31C of the MOSFET 31, respectively. The capacitor 34 is connected between the lead wires 27, 26. The capacitor 35 is connected between the gate 31C of the MOSFET 31 and the lead wire 26. The capacitor 36 is connected between the lead wires 28, 29.

Figure 2:
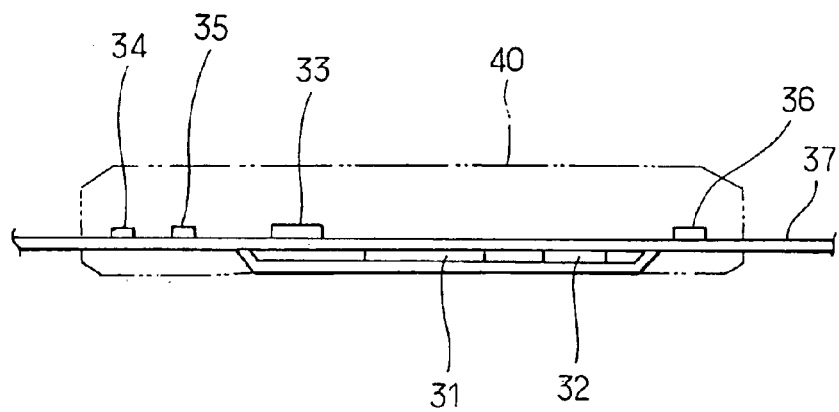
FIG. 2 is a side view showing the IC when viewed from an arrow direction II in FIG. 1.
Figure 3:
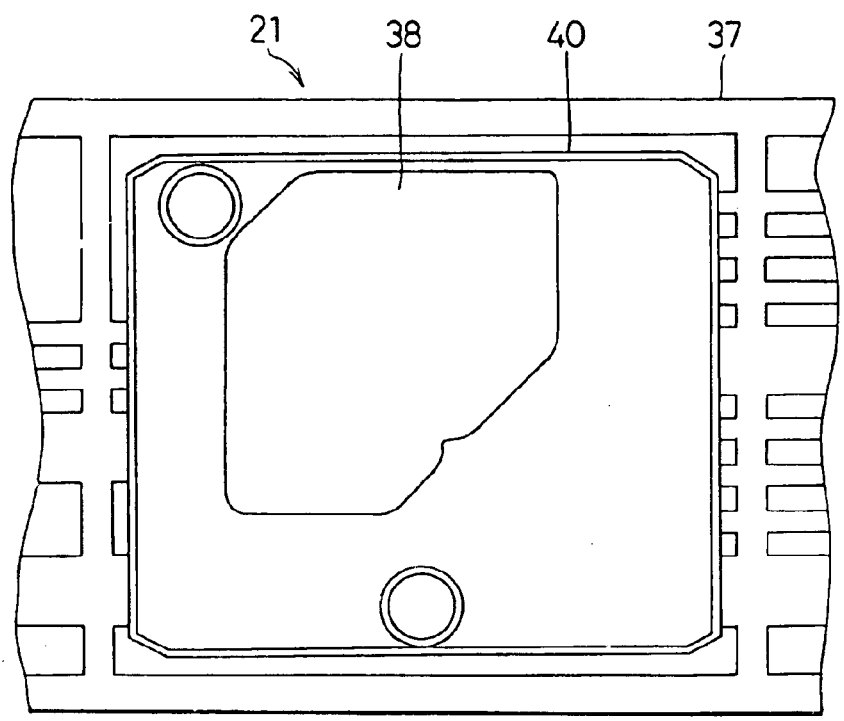
FIG. 3 is a bottom view showing the IC sealed by resin according to the first embodiment.
Figure 4:
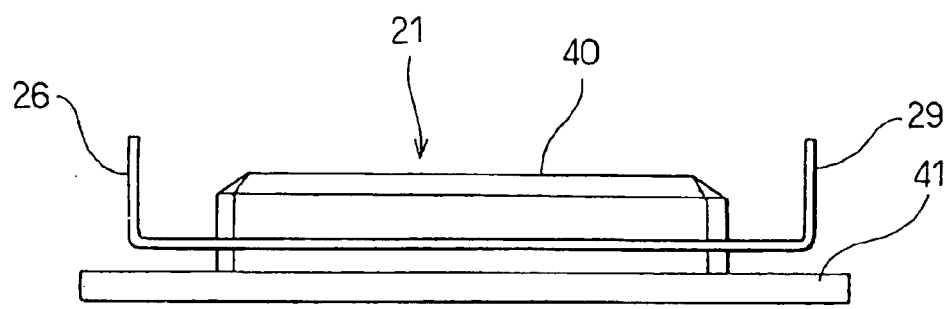
FIG. 4 is a side view showing the IC in a condition that a cooling plate is mounted according to the first embodiment.

FIG. 1 is a top view showing a lead frame 37 in a condition that the chips are mounted and wire bonding is executed in assembling processes. FIG. 2 is a side view when viewed from an arrow direction II in FIG. 1. Two-dot chain lines 40 shown in FIGS. 1, 2 show an outer shape of a package of the IC 21 after a sealing process by a resin. FIG. 3 is a bottom view showing the lead frame 37 in a condition that the lead frame 37 is sealed by resin with a sealing process. FIG. 4 is a side view in a condition that a cooling plate 41 is mounted to the package of the IC 21.

A first island 38, which is depressed, is formed at a center portion of the lead frame 37. The MOSFET 31 and the diode 32 are mounted on an upper surface of the first island 38. The undersurface of the MOSFET 31 is the drain 31B of the MOSFET 31, and the undersurface of the diode 32 is the cathode 32A of the diode 32. That is, the drain 31B of the MOSFET 31 is connected to the first island 38, and the cathode 32A of the diode 32 is also connected to the first island 38. As shown in FIG. 1, the first island 38 has a cut-away portion at its lower left portion. A second island 39 is formed adjacent to the cut-away portion of the first island 38. The driving IC 33 is mounted on an upper surface of the second island 39. The lead wire 28 is extended from the first island 38. The lead wires 26, 29 are extended from the second island 39 to opposite directions with each other. A plurality of aluminum wires are used for connecting between the source 31A of the MOSFET 31 and the lead wire 23, and between the anode 32B of the diode 32 and the lead wire 29 by wire bonding because the electrical current of the motor 32 flow through the connecting portions.

As shown in FIG. 3, the undersurface (non-chip-mounted surface) of the first island 38 is exposed from the undersurface (bottom surface) of the package 40 so that the undersurface of the first island 38 is flush with the undersurface of the package 40. The cooling plate 41 is mounted to the package 40 and the first island 38 as shown in FIG. 4.

Next, the function and the result of the first embodiment will be explained.

When the IC 21 receives the control signal from the ECU 30, the driving IC 33 in the IC 21 produces a PWM driving signal based on the control signal, and outputs the PWM driving signal to the gate 31C of the MOSFET 31. When the PWM driving signal is less than a threshold voltage of the MOSFET 31, the MOSFET 31 is turned on, and then electrical current from the MOSFET 31 flows through the motor 22 via the lead wire 28. Then, when the PWM driving signal is not less than the threshold voltage, the MOSFET 31 is turned off, and then the electrical current flowing through the motor 22 flows back to the diode 32. As a result, voltages in accordance with a duty ratio of the PWM driving signal are effectively applied to the motor 22.

When electrical currents flows through the MOSFET 31 and the diode 32, heat losses occur and temperatures of the chips, which are the MOSFET 31 and the diode 32, rise. When the electrical current (electrical current for the motor) outputted from the IC 21 increases, the heat loss (drain loss) of the MOSFET 31 increases. The heat loss of the diode 32 varies according to the electrical current outputted from the IC 21 and the duty ratio of the PWM driving signal.

In the first embodiment, the MOSFET 31 and the diode 32 are included in a high-side switch, so that the drain 31B of the MOSFET 31 and the cathode 32A of the diode 32 have a common electrical potential. In addition, since the undersurface of the MOSFET 31 and the diode 32 are the drain 31B and the cathode 32A, respectively, both of the chips, which are the MOSFET 31 and the diode 32, can be mounted on the single island 38.

Figure 8:
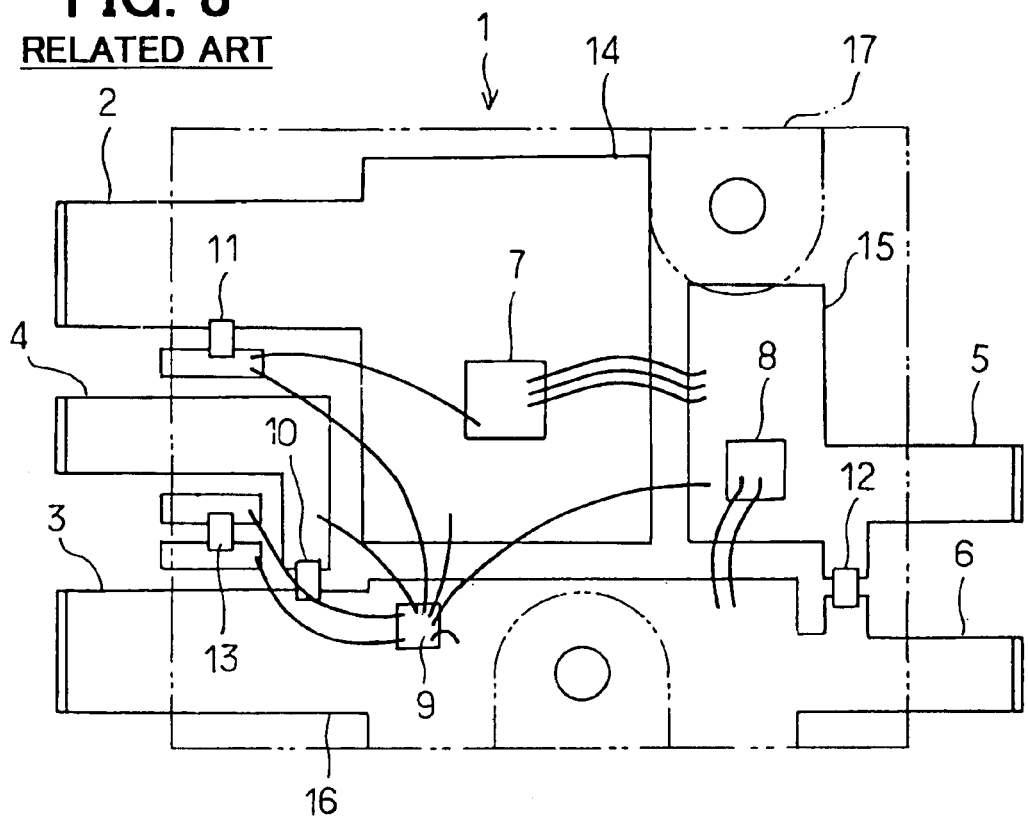
FIG. 8 is a top view showing an IC in a condition that chips are mounted according to a related art.
Figure 9:
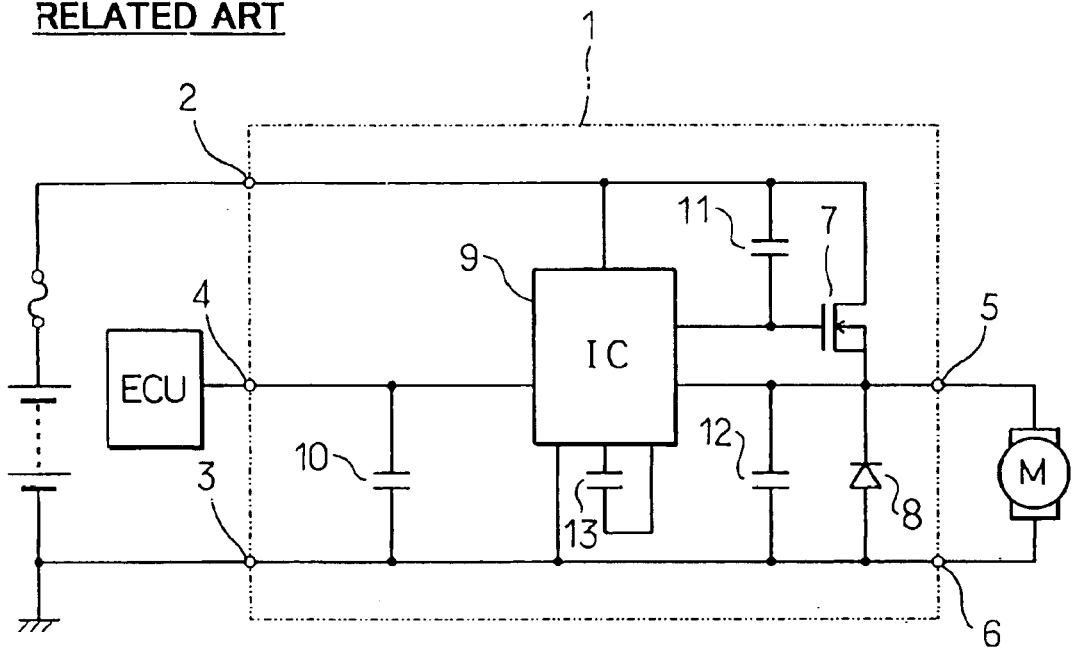
FIG. 9 is a circuit diagram showing circuit-components of the IC according to the related art.

When the MOSFET 31 and the diode 32 are mounted on the single island 38, heat radiation efficiency is improved in comparison with the related art in which the MOSFET 31 and the diode 32 are mounted on separate islands as shown in FIG. 8. This is because the island and the lead wires are effectively increased in size. The island and the lead wires contribute to the heat radiation from the MOSFET 31 and the diode 32. As a result, the island can be reduced in size as a whole, and the package 40 is reduced in size.

The first island 38 is depressed and the non-chip-mounted surface of the first island 38 is exposed from the undersurface of the package 40, so that the heat radiation efficiency can be improved and can increase. The cooling plate 41 is mounted to the undersurface of the package 40 and the depressed first island 38, so that the exposed surface of the first island 38 and the cooling plate 41 contact with each other. As a result, the heat radiation efficiency is further improved and increases. Therefore, the IC 21 can be operated under a high temperature environment, in which a vehicle mounted electrical device is used.

Second Embodiment

Figure 6:
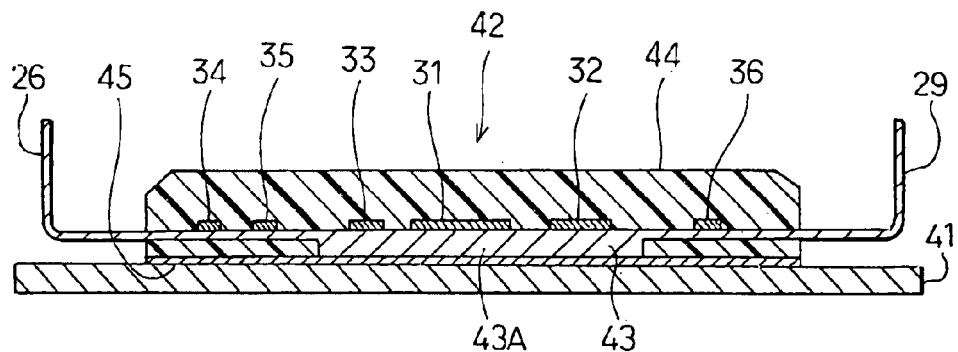
FIG. 6 is a sectional view showing an IC according to a second embodiment of the present invention.

In the second embodiment, an IC 42 shown in FIG. 6 has same circuit components shown in FIG. 5. The shape and the arrangement of the IC 42 are similar to FIG. 1 when viewed from above. However, a lead frame 43 of the second embodiment is different from the lead frame 37 of the first embodiment. The lead frame 37 of the first embodiment uses a material that has a uniform thickness. The lead frame 43 of the second embodiment uses different shape material, which has a special shape in cross section. The lead frame 43 has a thick portion 43A along with the direction II shown in FIG. 1. The first island 38 and the second island 39 are disposed on the thick portion 43A of the lead frame 43. The upper surface (chip mounted surface) of the lead frame 43 has a flat surface.

The undersurface (non-chip-mounted surface) of the thick portion 43A of the lead frame 43 is exposed so that the undersurface of the thick portion 43A is flush with the undersurface (bottom surface) of the package 44 sealed by the resin. In such a situation, because both of the first island 38 and the second island 39, which have different electrical potential, are exposed from the package 44, the cooling plate 41 is mounted to the package 44 and the thick portion 43A via an insulation sheet.

According to the second embodiment, the non-chip-mounted surface of the first island 38, on which the MOSFET 31 and the diode 32 that generate heat are mounted, is exposed from the undersurface of the package 44. As a result, the heat radiation efficiency is improved and increases. In addition, when the cooling plate 41 is mounted to the undersurface of the package 44 and the thick portion 43A, although it is necessary to be mounted via the insulation sheet 45, the cooling plate 41 can directly cool the first island 38 that mounts the MOSFET 31 and the diode 32. Therefore, the IC 42 can be operated under the high temperature environment, in which the vehicle mounted electrical device is used.

Third Embodiment

Figure 7:
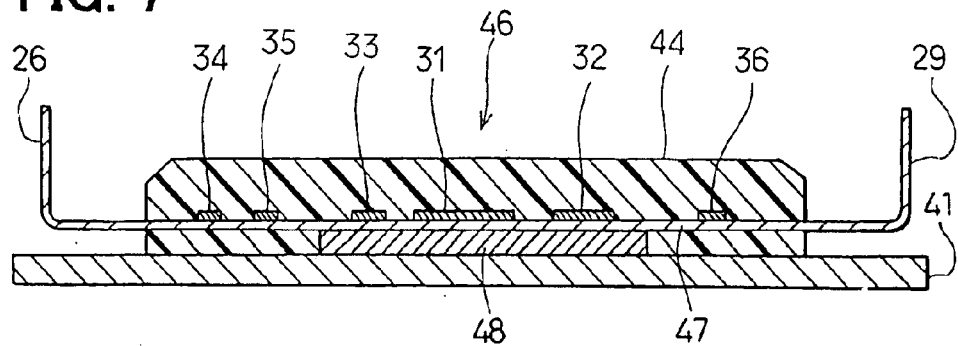
FIG. 7 is a sectional view showing an IC according to a third embodiment of the present invention.

In the third embodiment, an IC 46 shown in FIG. 7 has same circuit components shown in FIG. 5. The shape and the arrangement of the IC 46 are similar to FIG. 1 when viewed from above. The IC 46 has a lead frame 47 that has same shape and same arrangement as the lead frame 37 of the first embodiment. A heat radiation element (plate member) 48 is integrally mounted to the undersurface of the first island 38 of the lead frame 47 by a crushing process or a caulking process. The heat radiation element 48 has approximately a same shape as the first island 38, and is made of a certain material, such as a copper, that has high thermal conductivity.

The undersurface (non-chip-mounted surface) of the heat radiation element 48 is exposed from the undersurface (bottom surface) of the package 44 so that the undersurface of the heat radiation element 48 is flush with the undersurface of the package 44. The cooling plate 41 is mounted to the package 44 and the heat radiation element 48.

According to the third embodiment, the first island 38 on which the MOSFET 31 and the diode 32 are mounted is integral with the heat radiation element 48, which has high thermal conductivity and is exposed from the undersurface of the package 44. As a result, the heat radiation efficiency is improved and increases. In addition, when the cooling plate 41 is mounted to the undersurface of the package 44 and the heat radiation element 48, the heat radiation efficiency of the first island 38 is further improved and increases. Therefore, the IC 46 can be operated under the high temperature environment, in which the vehicle mounted electrical device is used.

The present invention should not be limited to the embodiments discussed above and shown in the figures, but may be implemented in various ways without departing from the spirit of the invention. For example, a PNP bipolar transistor and a P-channel type IGBT can be used instead of the MOSFET 31. When the PNP bipolar transistor is used instead of the MOSFET 31, an emitter electrode, a collector electrode, and a base electrode of the PNP bipolar transistor are connected to the lead wire 23, 28, and the fifth pad of the driving IC 33, respectively. The cooling plate 41 may be mounted, if necessary.

What is claimed is:

1. A semiconductor integrated circuit that is connected to an external load and a power supply, comprising:
    a lead frame;
    a first lead wire connected to a high electric potential side of the power supply;
    a second lead wire connected to a high electric potential side of the external load;
    a third lead wire connected to a low electric potential side of the external load;
    a transistor that is one of a P-channel type and a PNP type, the P-channel type having a source connected to the first lead wire and having a drain connected to the second lead wire, and the PNP type having an emitter connected to the first lead wire and having a collector connected to the second lead wire; and
    a diode for circulating an electrical current and having a cathode and an anode, the cathode being connected to the second lead wire, and the anode being connected to the third lead wire,
    wherein the transistor and the diode are mounted on a single island of the lead frame.

2. The semiconductor integrated circuit according to claim 1, further comprising:
    a resin member that covers the transistor, the diode, and the lead frame, and exposes a non-chip-mounted surface of the island.

3. The semiconductor integrated circuit according to claim 2, wherein the island is depressed so that the non-chip-mounted surface of the depressed island is exposed from the resin member.

4. The semiconductor integrated circuit according to claim 2, wherein the island has a thick portion on which the diode and the transistor are mounted so that the non-chip-mounted surface of the thick portion of the island is exposed from the resin member.

5. The semiconductor integrated circuit according to claim 1, further comprising:
    a plate member having high thermal conductivity and integrally mounted to the island on which the transistor and the diode are mounted; and
    a resin member that covers the transistor, the diode, the lead frame, and the plate member, and exposes a non-chip-mounted surface of the plate member.

6. The semiconductor integrated circuit according to claim 2, further comprising:
    a cooling plate mounted to the exposed surface of the island.

7. The semiconductor integrated circuit according to claim 2, wherein the non-chip-mounted surface of the island is flush with a surface of the resin member.

8. The semiconductor integrated circuit according to claim 1, wherein the cathode of the diode and one of the drain of the P-channel transistor and the collector of the PNP transistor are connected to the island.

9. A semiconductor integrated circuit having a lead frame, comprising:
- a transistor that has a first terminal connected to a first lead wire and a second terminal connected to a second lead wire; and
- a diode having a cathode and an anode, the cathode being connected to the second lead wire, and the anode being connected to a third lead wire,
- wherein the second terminal of the transistor and the cathode of the diode have a common electrical potential, and
- the transistor and the diode are mounted on a single island of the lead frame so that the second terminal of the transistor and the cathode of the diode are connected to the island.

10. The semiconductor integrated circuit according to claim 9, wherein the transistor is a P-channel type, the first terminal of the transistor is a source of the P-channel transistor, and the second terminal of the transistor is a drain of the P-channel transistor.

11. The semiconductor integrated circuit according to claim 9, wherein the transistor is a PNP type, the first terminal of the transistor is an emitter of the PNP type, and the second terminal of the transistor is a collector of the PNP type.

12. The semiconductor integrated circuit according to claim 9, wherein the first lead wire is connected to a high electric potential side of a power supply, the second lead wire is connected to a high electric potential side of an external load, and the third lead wire is connected to a low electric potential side of the external load.

* * * * *